US012463122B2

(12) United States Patent
Choi et al.

(10) Patent No.: US 12,463,122 B2
(45) Date of Patent: Nov. 4, 2025

(54) SEMICONDUCTOR PACKAGE

(71) Applicant: SAMSUNG ELECTRONICS CO., LTD., Suwon-si (KR)

(72) Inventors: Pilsung Choi, Cheonan-si (KR); Donguk Kwon, Asan-si (KR); Sangsoo Kim, Cheonan-si (KR); Wooram Myung, Suwon-si (KR); Jiwon Shin, Daejeon (KR); Sehun Ahn, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 715 days.

(21) Appl. No.: 17/842,262

(22) Filed: Jun. 16, 2022

(65) Prior Publication Data

US 2023/0119406 A1    Apr. 20, 2023

(30) Foreign Application Priority Data

Oct. 20, 2021   (KR) .......................... 10-2021-0139833

(51) Int. Cl.
*H01L 23/498*   (2006.01)
*H01L 23/00*    (2006.01)
*H01L 23/31*    (2006.01)

(52) U.S. Cl.
CPC .... *H01L 23/49811* (2013.01); *H01L 23/3128* (2013.01); *H01L 23/49833* (2013.01); *H01L 24/29* (2013.01); *H01L 24/05* (2013.01); *H01L 24/13* (2013.01); *H01L 24/16* (2013.01); *H01L 24/81* (2013.01); *H01L 24/83* (2013.01);
(Continued)

(58) Field of Classification Search
CPC .......... H01L 23/49811; H01L 23/3128; H01L 23/49833; H01L 24/29; H01L 24/05; H01L 24/13; H01L 24/16; H01L 24/81; H01L 24/83; H01L 2224/0401; H01L 2224/05599; H01L 2224/13147; H01L 2224/16227; H01L 23/50; H01L 25/0657;
(Continued)

(56) References Cited

U.S. PATENT DOCUMENTS

5,175,060 A * 12/1992 Enomoto ................ H01L 24/83
                                                          257/676
8,779,570 B2    7/2014 Shim et al.
(Continued)

*Primary Examiner* — Samuel A Gebremariam
(74) *Attorney, Agent, or Firm* — Sughrue Mion, PLLC (57) ABSTRACT

A semiconductor package includes: a lower substrate including a lower wiring layer; a semiconductor chip disposed on the lower substrate, the semiconductor chip including a first surface facing the lower substrate and a second surface opposite to the first surface; an upper substrate disposed on the lower substrate and the semiconductor chip, the upper substrate including a lower surface on which support members protruding toward the second surface of the semiconductor chip are disposed; a connection structure disposed between the lower substrate and the upper substrate; an encapsulant filling a space between the lower substrate and the upper substrate and encapsulating at least a portion of the semiconductor chip and the connection structure; and adhesive members disposed on the second surface of the semiconductor chip such as to correspond to the support members, respectively, the adhesive members disposed in contact with the second surface and the support members.

20 Claims, 9 Drawing Sheets

(52) U.S. Cl.
CPC .......... *H01L 2224/0401* (2013.01); *H01L 2224/05599* (2013.01); *H01L 2224/13147* (2013.01); *H01L 2224/16227* (2013.01); *H01L 2224/2929* (2013.01); *H01L 2224/29299* (2013.01); *H01L 2224/81411* (2013.01); *H01L 2224/81416* (2013.01); *H01L 2224/81424* (2013.01); *H01L 2224/81439* (2013.01); *H01L 2224/81444* (2013.01); *H01L 2224/81447* (2013.01); *H01L 2224/81455* (2013.01); *H01L 2224/81466* (2013.01); *H01L 2224/83399* (2013.01); *H01L 2924/014* (2013.01)

(58) Field of Classification Search
CPC ............ H01L 2225/1058; H01L 23/562; H01L 24/32
See application file for complete search history.

(56) References Cited

U.S. PATENT DOCUMENTS

| | | |
|---|---|---|
| 10,361,177 B2 | 7/2019 | Kim et al. |
| 10,475,749 B2 | 11/2019 | Kim |
| 10,825,774 B2 | 11/2020 | Oh et al. |
| 10,867,974 B2 | 12/2020 | Kim |
| 2012/0013007 A1 | 1/2012 | Hwang et al. |
| 2017/0098634 A1 | 4/2017 | Kumar et al. |
| 2021/0183777 A1 | 6/2021 | Yim et al. |

* cited by examiner

SEMICONDUCTOR PACKAGE

CROSS-REFERENCE TO THE RELATED APPLICATION

This application claims benefit of priority to Korean Patent Application No. 10-2021-0139833 filed on Oct. 20, 2021 in the Korean Intellectual Property Office, the disclosure of which is incorporated herein by reference in its entirety.

BACKGROUND

Embodiments of the present disclosure relate to a semiconductor package.

In line with the recent trend for high performance and miniaturization of electronic devices, package-on-package (POP) technology has been developed in a semiconductor packaging field. In such POP technology, two or more semiconductor packages are vertically stacked, and therefore, development of a technology for securing thickness uniformity of semiconductor packages is required.

SUMMARY

An aspect of the present disclosure is to provide a semiconductor package having improved thickness uniformity.

According to embodiments, a semiconductor package is provided. The semiconductor package includes: a lower substrate including a lower wiring layer; and a semiconductor chip disposed on the lower substrate. The semiconductor chip includes: a first surface facing the lower substrate, connection pads electrically connected to the lower wiring layer, the lower wiring layer disposed on the first surface, and a second surface opposite to the first surface. The semiconductor package further includes: an upper substrate disposed on the lower substrate and the semiconductor chip, the upper substrate including a lower surface on which support members protruding toward the second surface of the semiconductor chip are disposed, and the upper substrate further including an upper wiring layer; a connection structure disposed between the lower substrate and the upper substrate and electrically connecting the lower wiring layer to the upper wiring layer; an encapsulant filling a space between the lower substrate and the upper substrate and encapsulating at least a portion of each of the semiconductor chip and the connection structure; adhesive members disposed on the second surface of the semiconductor chip such as to correspond to the support members, respectively, the adhesive members disposed in contact with each of the second surface and the support members; and connection bumps disposed below the lower substrate and electrically connected to the lower wiring layer.

According to embodiments, a semiconductor package is provided. The semiconductor package includes: a lower substrate including a lower wiring layer; and a semiconductor chip disposed on the lower substrate. The semiconductor chip includes: a first surface facing the lower substrate, connection pads electrically connected to the lower wiring layer, the lower wiring layer disposed on the first surface, and a second surface opposite to the first surface. The semiconductor package further includes: an upper substrate disposed on the lower substrate and the semiconductor chip, the upper substrate including a lower surface on which support members protruding toward the second surface of the semiconductor chip are disposed, and the upper substrate further including an upper wiring layer; a connection structure disposed between the lower substrate and the upper substrate and electrically connecting the lower wiring layer to the upper wiring layer; and adhesive members disposed on the second surface of the semiconductor chip such as to correspond to the support members, respectively, and the adhesive members each comprise a protrusion that respectively extends outward from a side surface of a corresponding one of the support members in a first direction parallel to the second surface, wherein the protrusion of each of the adhesive members is in contact with at least a portion of the side surface of each of the support members, respectively.

According to embodiments, a semiconductor package is provided. The semiconductor package includes: a lower substrate; a semiconductor chip disposed on the lower substrate, the semiconductor chip including a first surface facing the lower substrate, and further including a second surface opposite to the first surface; an upper substrate disposed on the lower substrate and the semiconductor chip, the upper substrate including a lower surface on which support members protruding toward the second surface of the semiconductor chip are disposed; adhesive members disposed between the second surface of the semiconductor chip and the support members such as to correspond to the support members, respectively; and an encapsulant disposed between the lower substrate and the upper substrate and covering at least a portion of each of the semiconductor chip, the support members, and the adhesive members.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present disclosure will be described with reference to the accompanying drawings.

Figure 1A:
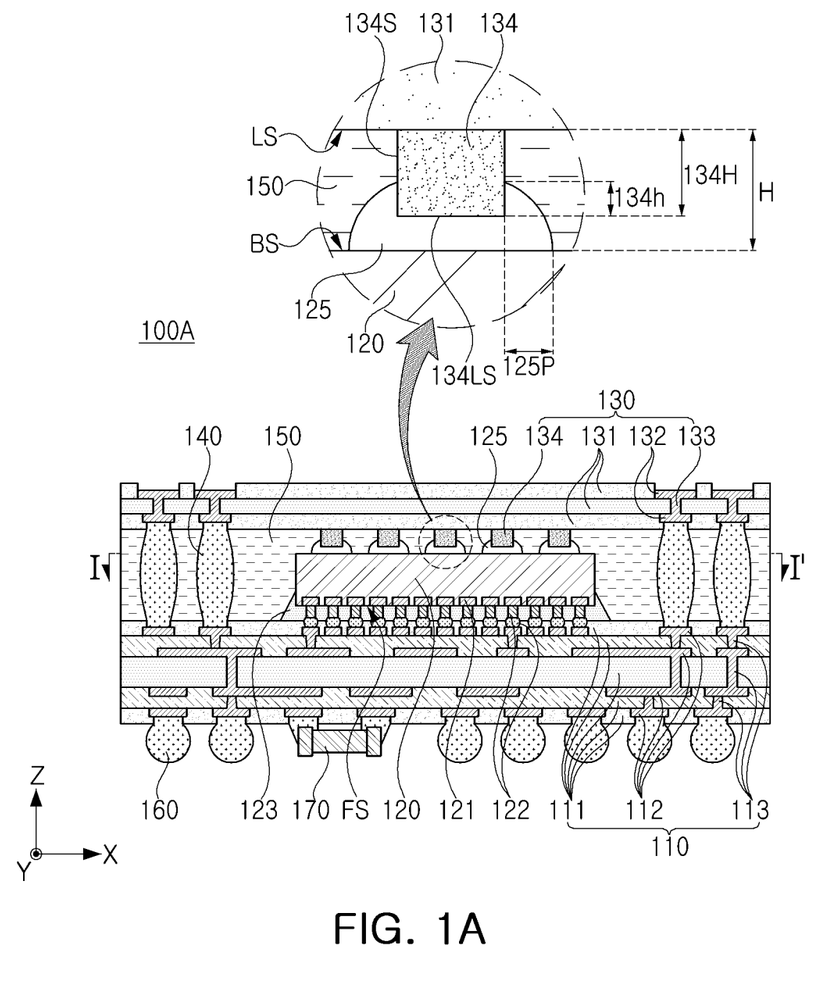
FIG. 1A is a cross-sectional view illustrating a semiconductor package according to an embodiment of the present disclosure.
Figure 1B:
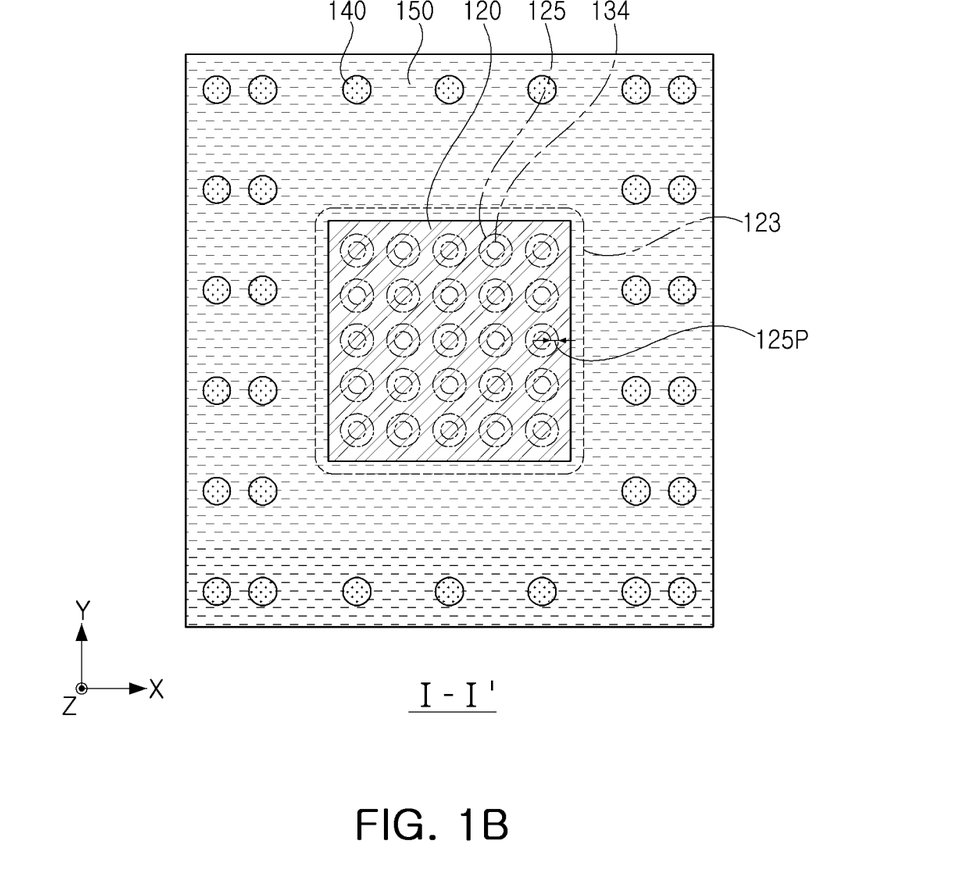
FIG. 1B is a plan view illustrating a cross-section taken along line I-I' of FIG. 1A.

FIG. 1A is a cross-sectional view illustrating a semiconductor package 100A according to an embodiment of the present disclosure, and FIG. 1B is a plan view illustrating a cross-section taken along line I-I' of FIG. 1A.

Referring to FIGS. 1A and 1B, a semiconductor package 100A according to an example embodiment may include a lower substrate 110, a semiconductor chip 120, an upper substrate 130, and a connection structure 140. In addition, the semiconductor package 100A may further include an encapsulant 150, a connection bump 160, and/or a passive element 170.

According to embodiments of the present disclosure, by introducing a plurality of support members 134 to a lower surface LS of the upper substrate 130 of the semiconductor package 100A, a joint pitch between the lower surface LS of the upper substrate 130 and an inactive surface (hereinafter, referred to as a second surface BS) of the semiconductor chip 120 may be maintained and warpage occurring during a manufacturing process may be decreased. In addition, by introducing adhesive members 125 bonding the support members 134 to the second surface BS of the semiconductor chip 120, an occurrence of a void between the support members 134 and the second surface BS of the semiconductor chip 120 may be prevented, and interfacial delamination and warpage imbalance caused by voids may be decreased. Hereinafter, each component will be described in detail with reference to the drawings.

The lower substrate 110 is a support substrate on which the semiconductor chip 120 is mounted, and may be a substrate for a package including a lower wiring layer 112 for rewiring the semiconductor chip 120. The substrate for a package may include a printed circuit board (PCB), a ceramic substrate, a glass substrate, a tape wiring board, and the like. For example, the lower substrate 110 may include an insulating layer 111, the lower wiring layer 112, and a lower wiring via 113.

The insulating layer 111 may include an insulating resin. The insulating resin may include a thermosetting resin such as an epoxy resin, a thermoplastic resin such as polyimide, or a resin having an inorganic filler and/or glass fiber (glass cloth or glass fabric) impregnated in the thermosetting resin and the thermoplastic resin, for example, a prepreg, Ajinomoto build-up film (ABF), flame retardant level 4 (FR-4), bismaleimide triazine (BT), or a photosensitive resin such as photoimageable dielectric (PID). The insulating layer 111 may include a plurality of the insulating layer 111 stacked in a vertical direction (the Z-axis direction). Depending on the process, a boundary between the plurality of the insulating layer 111 may not be apparent. In addition, for convenience of explanation, only five of the insulating layer 111 are illustrated in the drawings, but embodiments of the present disclosure are not limited thereto. According to an embodiment, a fewer or greater number of the insulating layer 111 may be formed. For example, an insulating layer 111 (referred to as a core insulating layer) located in the center of the plurality of the insulating layer 111 may be thicker than other ones of the insulating layer 111 stacked above or below the core insulating layer. The core insulating layer may improve rigidity of the substrate, thereby suppressing warpage of the substrate. The core insulating layer may be formed using, for example, a copper clad laminate (CCL), an unclad CCL, a glass substrate, or a ceramic substrate. According to an embodiment, the lower substrate 110 may not include the core insulating layer. The uppermost and/or lowermost insulating layer 111, among the plurality of the insulating layers, may be a solder resist layer protecting the lower wiring layer 112 from external physical/chemical damage. The solder resist layer may include an insulating material and may be formed using, for example, photo solder resist (PSR).

The lower wiring layer 112 may include, for example, copper (Cu), aluminum (Al), silver (Ag), tin (Sn), gold (Au), nickel (Ni), lead (Pb), titanium (Ti), or alloys thereof. The lower wiring layer 112 may include, for example, a ground (GND) pattern, a power (PWR) pattern, and a signal (S) pattern. The signal (S) pattern may provide a path through which various signals except for the ground (GND) pattern and the power (PWR) pattern, for example, a data signal and the like are transmitted/received. The lower wiring layer 112 may be provided as a plurality of the lower wiring layer 112 respectively disposed below the plurality of the insulating layer 111. The plurality of the lower wiring layer 112 may be electrically connected to each other through the lower wiring via 113. The plurality of the lower wiring layer 112 may include landing pads on which the semiconductor chip 120, the connection structure 140, the connection bump 160, and the passive element 170 are mounted, respectively. The landing pads may be formed to have different pitches depending on a mounted object. In an example, the lowermost lower wiring layer 112 in contact with the connection bump 160 may be formed to have a greater thickness than a plurality of the lower wiring layer 112 thereabove. The number of the lower wiring layer 112 may be determined according to the number of the insulating layer 111, and may include greater or fewer layers than shown in the drawings.

The lower wiring via 113 may be electrically connected to the lower wiring layer 112 and may include a signal via, a ground via, and a power via. The lower wiring via 113 may include a metal material including, for example, copper (Cu), aluminum (Al), silver (Ag), tin (Sn), gold (Au), nickel (Ni), lead (Pb), or titanium (Ti), or alloys thereof. The lower wiring via 113 may be a filled via formed by filling an inside of a via hole or a conformal via formed by forming a metal material on an inner wall of a via hole. The lower wiring via 113 may be integrated with the lower wiring layer 112, but embodiments of the present disclosure are not limited thereto.

The semiconductor chip 120 may be disposed on the lower substrate 110 and may have a first surface FS facing the lower substrate 110, connection pads 121 electrically connected to the lower wiring layer 112 that is disposed on the first surface FS, and a second surface BS positioned opposite to the first surface FS. The semiconductor chip 120 may be mounted on the lower substrate 110 in a flip-chip manner. The semiconductor chip 120 may be connected to the lower wiring layer 112 through metal bumps in the form of balls or posts. For example, the semiconductor chip 120 may be electrically connected to the lower wiring layer 112 through a bump structure 122 to which a solder ball and a copper (Cu) pillar are coupled, but is not limited thereto. According to an embodiment, the semiconductor chip 120 may be directly connected to the lower wiring layer 112 or the lower wiring via 113 without a separate bump. The semiconductor chip 120 may include silicon (Si), germanium (Ge), or gallium arsenide (GaAs), and various types of integrated circuits (ICs) may be formed. The ICs may include a processor chip such as a central processor (e.g., CPU), a graphics processor (e.g., GPU), a field programmable gate array (FPGA), an application processor (AP), a digital signal processor, a cryptographic processor, a microprocessor, a microcontroller, etc. but are not limited thereto, and may be a logic chip such as an analog-to-digital converter, an application-specific IC (ASIC), or a memory chip such as a volatile memory (e.g., DRAM), non-volatile memory (e.g., ROM and flash memory), etc. In some embodiments, an underfill member 123 may be disposed between the lower substrate 110 and the first surface FS of the semiconductor chip 120. The underfill member 123 may have a capillary underfill (CUF) structure having a boundary distinguished from the encapsulant 150, or in some embodiment, the underfill member 123 may have a molded underfill (MUF) structure integrally formed with the encapsulant 150.

The upper substrate 130 may be disposed on the lower substrate 110 and the semiconductor chip 120 to provide a redistribution layer on the semiconductor package 100A and may be mentioned as an interposer substrate positioned between a lower package and an upper package in a package-on-package (POP) structure. The upper substrate 130 may have a lower surface LS on which the support members 134 protruding toward the second surface BS of the semiconductor chip 120 are disposed, and may include an insulating layer 131, an upper wiring layer 132, and an upper wiring via 133. The insulating layer 131, the upper wiring layer 132, and the upper wiring via 133 have characteristics the same as or similar to those of the insulating layer 111, the lower wiring layer 112, and the lower wiring via 113 of the lower substrate 110, and thus, redundant descriptions thereof will be omitted.

According to the present disclosure, since the plurality of support members 134 and the adhesive members 125 bonding the plurality of support members 134 to the second surface BS of the semiconductor chip 120 are introduced to the lower surface LS of the upper substrate 130, a joint pitch may be maintained between the second surface BS of the semiconductor chip 120 and the lower surface LS of the upper substrate 130, and interfacial delamination occurring between the support members 134 and the second surface BS, warpage imbalance, and the like may be decreased. For example, when a height 134H of the support members 134 in a direction (the Z-axis direction), perpendicular to the second surface BS, is in the range of about 15 µm to about 25 µm, a distance H between the second surface BS of the semiconductor chip 120 and the lower surface LS of the upper substrate 130 may be in the range of about 15 µm to about 35 µm, about 20 µm to about 35 µm, or about 20 µm to about 30 µm. Here, the distance H between the second surface BS and the lower surface LS may vary depending on the design, for example, the height 134H of the support members 134, the amount of application of the adhesive members 125, and the like, and is not limited to the numerical ranges described above.

The support members 134 may each include a lower surface 134LS facing the second surface BS of the semiconductor chip 120, and a side surface 134S extending from the lower surface 134LS to the lower surface LS of the upper substrate 130, and may be disposed to overlap the semiconductor chip 120 in a direction (the Z-axis direction), perpendicular to the second surface BS below the lower surface LS of the upper substrate 130. The support members 134 may control warpage of the upper substrate 130. For example, when the upper substrate 130 is bent during the manufacturing process of the semiconductor package 100A, the support members 134 may come into contact with the second surface BS to support the upper substrate 130, thereby controlling warpage of the upper substrate 130. According to comparative embodiments, if the upper substrate 130 is excessively bent, at least some of the support members 134 may be spaced apart from the second surface BS, and a void not filled with the encapsulant 150 may occur. Meanwhile, in embodiments of the present disclosure, the occurrence of voids may be prevented by introducing the adhesive members 125 bonding the support members 134 to the second surface BS of the semiconductor chip 120. For example, at least some of the support members 134 are spaced apart from the second surface BS of the semiconductor chip 120, and the adhesive members 125 may fill the space between the at least some of the support members 134 and the second surfaces BS of the semiconductor chip 120. In FIG. 1A, all of the support members 134 are illustrated as being spaced apart from the second surface BS, but some of the support members 134 may be in contact with the second surface BS. The support members 134 may be formed by patterning, for example, photo solder resist (PSR) applied on the lower surface LS of the upper substrate 130. The number and pitch of the support members 134 may be variously modified according to design.

The adhesive members 125 are disposed on the second surface BS of the semiconductor chip 120 to correspond to the support members 134, respectively, and may be in contact with each of the second surface BS of the semiconductor chip 120 and the support members 134. For example, the adhesive members 125 may have a protrusion 125P extending outwardly further than a width of the support members 134 in a direction (e.g., the X-axis direction), parallel to the second surface BS, and the adhesive members 125 (e.g., each protrusion 125P) may contact at least a portion of the side surface 134S of a corresponding one of the support members 134. For example, a width of the protrusion 125P in a direction e.g., the X-axis direction), parallel to the second surface BS, may be greater than a height 134h of the protrusion 125P in contact with the side surface 134S of the support members 134 in a direction (e.g., the Z-axis direction), perpendicular to the second surface BS. According to embodiments, the width of the protrusion 125P of one of the adhesive members 125 refers to a width from the side surface 134S of the corresponding one of the support members 134 to an outermost part of the one of the adhesive members in a direction (e.g., the X-axis direction), parallel to the second surface BS. According to embodiments, the height of the protrusion 125P of one of the adhesive members 125 refers to a height from the lower surface 134SL of the corresponding one of the support members 134 to an uppermost part of the one of the adhesive members in a direction (e.g., the Z-axis direction), perpendicular to the second surface BS. The adhesive members 125 (e.g., each protrusion 125P) are spaced apart from each other, and the space between the adhesive members 125 may be filled with the encapsulant 150. At least some of the adhesive members 125 may be interposed between the second surface BS of the semiconductor chip 120 and the support members 134 to prevent an occurrence of voids between the support members 134 and the semiconductor chip 120. Accordingly, the encapsulant 150 may cover at least a portion of each of the second surface BS of the semiconductor chip 120, an outer surface of the protrusion 125P, and the side surface 134S of the support members 134 exposed from respective ones of the protrusion 125P. The adhesive members 125 may include an insulating resin, for example, a thermosetting resin, a thermoplastic resin, or a mixture thereof, but a material constituting the adhesive members 125 is not particularly limited.

The connection structure 140 may be disposed between the lower substrate 110 and the upper substrate 130, and may provide a vertical connection path electrically connecting the lower wiring layer 112 and the upper wiring layer 132. The connection structure 140 may have a spherical or ball shape formed of a low-melting-point metal such as tin (Sn), indium (In), bismuth (Bi), antimony (Sb), copper (Cu), silver (Ag), zinc (Zn), or lead (Pb), or alloys thereof (e.g., Sn—Ag—Cu).

The encapsulant 150 may fill a space between the lower substrate 110 and the upper substrate 130, and may encapsulate at least a portion of each of the semiconductor chip 120 and the connection structure 140. The encapsulant 150 may include, for example, a thermosetting resin such as an epoxy resin, a thermoplastic resin such as polyimide, a prepreg containing an inorganic filler and/or glass fiber, Ajinomoto build-up film (ABF), flame retardant level 4 (FR-4), bismaleimide triazine (BT), epoxy molding compound (EMC). According to embodiments of the present disclosure, since the support members 134 and the second surface BS of the semiconductor chip 120 are bonded by the adhesive members 125, the encapsulant 150 may not be interposed between the support members 134 and the second surface BS of the semiconductor chip 120. Accordingly, the encapsulant 150 may be formed to surround at least a portion of each of the semiconductor chip 120, the support members 134, and the adhesive members 125.

The connection bump 160 may be disposed below the lower substrate 110 and may be electrically connected to the lower wiring layer 112. The connection bump 160 may physically and/or electrically connect the semiconductor package 100A to an external device. The connection bump 160 may include a conductive material and may have a ball, pin, or lead shape. For example, the connection bump 160 may be a solder ball. At least one passive element 170 may be disposed on the lower substrate 110. The passive element 170 may include, for example, a capacitor such as a multilayer ceramic capacitor (MLCC) or a low inductance chip capacitor (LICC), an inductor, and beads. For example, the passive element 170 may be a land-side capacitor (LSC) disposed on the lower surface of the lower substrate 110. However, embodiments of the present disclosure are not limited thereto, and depending on the embodiment, the passive element 170 may be a die-side capacitor (DSC) mounted on the upper surface of the lower substrate 110 or an embedded type capacitor embedded in the lower substrate 110.

Figure 2:
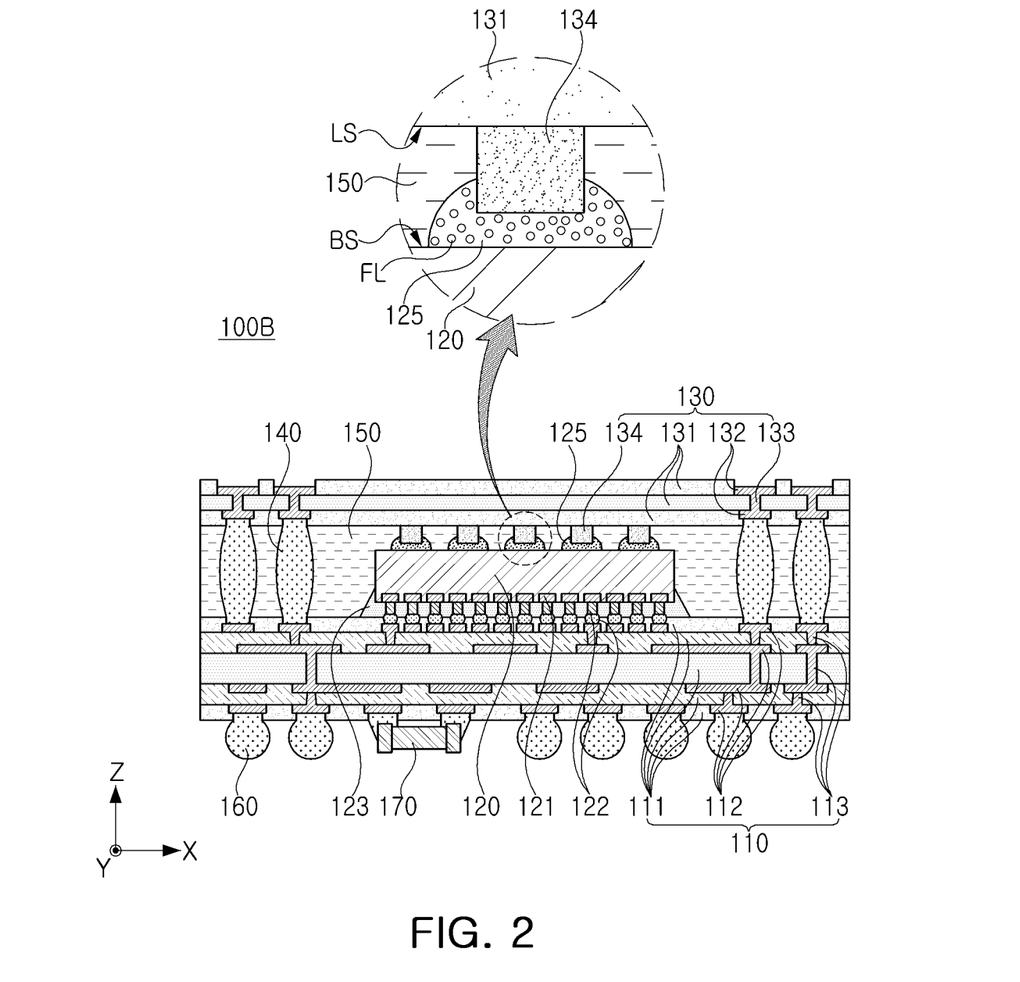
FIG. 2 is a cross-sectional view illustrating a semiconductor package according to an embodiment of the present disclosure.

FIG. 2 is a cross-sectional view illustrating a semiconductor package 100B according to an embodiment of the present disclosure.

Referring to FIG. 2, the semiconductor package 100B according to an embodiment has characteristics the same as or similar to those described above with reference to FIGS. 1A and 1B except for including fillers dispersed in adhesive members, so redundant descriptions thereof will be omitted. In the present embodiment, the adhesive members 125 may include an insulating resin and fillers FL dispersed in the insulating resin. The fillers FL may be interposed between the support members 134 and the second surface BS of the semiconductor chip 120. The insulating resin may include a thermosetting resin, a thermoplastic resin, or a mixture thereof. The fillers FL may be added to the insulating resin to satisfy mechanical properties, thermal properties, and electrical properties required for the adhesive members 125. For example, the fillers FL may control fluidity of the insulating resin to prevent overflow of the adhesive members 125 and secure a gap between the support members 134, or improve adhesion of the adhesive members 125 to effectively suppress interfacial delamination between the semiconductor chip 120 and the support members 134. The fillers FL may include an insulating filler or a conductive filler. The insulating filler may include, for example, inorganic fillers such as boron nitride, alumina, silica, aluminum nitride, magnesium oxide, silicon oxide, aluminum hydroxide, and barium sulfate. The conductive filler may be, for example, carbon fibers or conductive particles such as metal balls, or may have a metal material such as gold (Au), silver (Ag), nickel (Ni) or lead (Pd) applied on a surface of a core particle.

Figure 3:
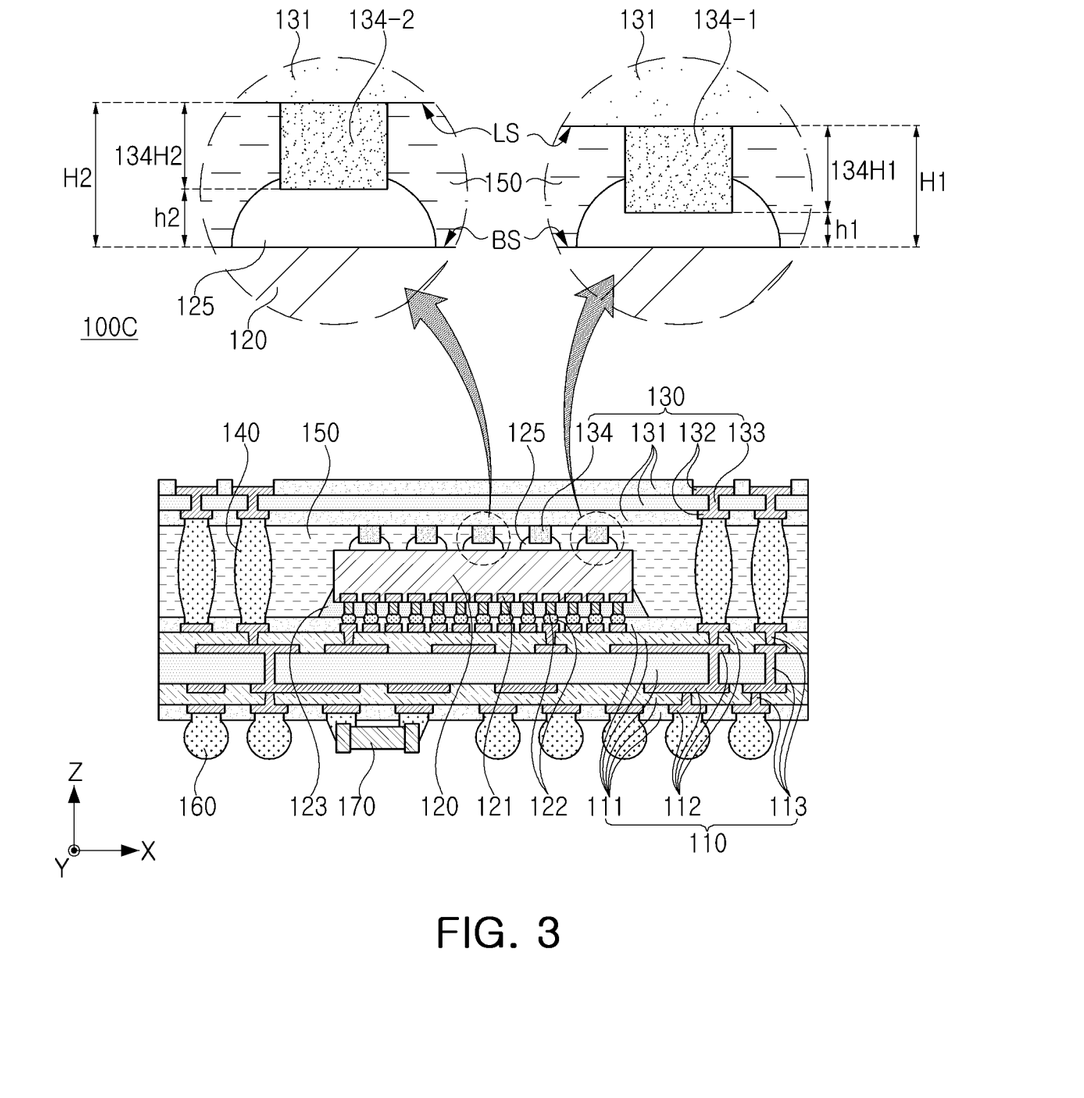
FIG. 3 is a cross-sectional view illustrating a semiconductor package according to an embodiment of the present disclosure.

FIG. 3 is a cross-sectional view illustrating a semiconductor package 100C according to an embodiment of the present disclosure.

Referring to FIG. 3, the semiconductor package 100C according to an example embodiment has characteristics the same as or similar to those described above with reference to FIGS. 1A to 2 except that a first interval h1 between some support members 134-1 and the semiconductor chip 120 is different from a second interval h2 between other second support members 134-2 and the semiconductor chip 120, and thus, redundant descriptions thereof will be omitted. For example, the first interval h1 between one of the first support members 134-1 and the semiconductor chip 120 may be less than the second interval h2 between one of the second support members 134-2 and the semiconductor chip 120. A difference between the first interval h1 and the second interval h2 may be about 5 μm or less, for example, in the range of about 0.001 μm to about 5 μm, about 0.001 μm to about 3 μm, about 0.001 μm to about 2 μm, etc. In addition, a first distance H1 between the lower surface LS of the upper substrate 130 on which one of the first support members 134-1 is disposed and the second surface BS of the semiconductor chip 120 may be less than a second distance H2 between the lower surface LS of the upper substrate 130 on which one of the second support members 134-2 is disposed and the second surface BS of the semiconductor chip 120. The first distance H1 and the second distance H2 may be in a range of about 15 μm to about 35 μm, about 20 μm to about 35 μm, or about 20 μm to about 30 μm. In addition, a height 134H1 of each of the first support members 134-1 and a height 134H2 of each of the second support members 134-2 are substantially the same, and the first support members 134-1 may be positioned to overlap an outer portion of the semiconductor chip 120 in a vertical direction (the Z-axis direction), and the second support members 134-2 may be positioned to overlap a central portion of the semiconductor chip 120 in the vertical direction (the Z-axis direction). According to an embodiment, unlike those illustrated in the drawings, the first distance H1 between the lower surface LS on which the first support members 134-1 are disposed and the second surface BS of the semiconductor chip 120 may be greater than the second distance H2 between the lower surface LS of the upper substrate 130 on which one of the second support members 134-2 is disposed and the second surface BS of the semiconductor chip 120, and the first interval h1 may be greater than the second interval h2. Here, "substantially the same" means that the heights of the first support members 134-1 and the second support members 134-2 are not intentionally formed to be different in a designing and manufacturing process and may be understood as having a concept including process errors, etc. That is, the difference between the first interval h1 and the second interval h2 is caused by warpage of the upper substrate 130, and despite the gap difference, portions below the first support members 134-1 and the second support members 134-2 are filled with the adhesive members 125, so that unfilling of the encapsulant 150 and an occurrence of voids may be prevented.

Figure 4:
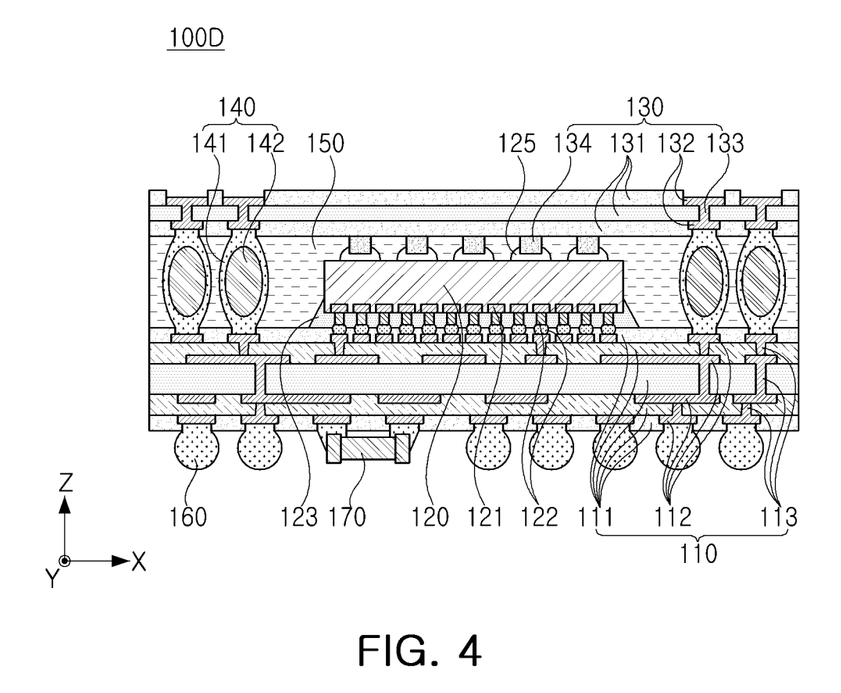
FIG. 4 is a cross-sectional view illustrating a semiconductor package according to an embodiment of the present disclosure.

FIG. 4 is a cross-sectional view illustrating a semiconductor package 100D according to an embodiment of the present disclosure.

Referring to FIG. 4, the semiconductor package 100D according to the example embodiment has characteristics the same as or similar to those described above with reference to FIGS. 1A to 3 except that the connection structure 140 includes a core 142 and a solder layer 141 covering a surface of the core 142, and thus, redundant descriptions thereof will be omitted. In the present embodiment, the connection structure 140 may have a core ball structure including the core 142 formed in the center and the solder layer 141 covering the core 142. The core 142 may include a polymer material including a thermoplastic resin, a thermosetting resin, or a metal material distinct from solder. The solder layer 141 may include tin (Sn) or an alloy including tin (Sn). Such a core ball structure may maintain a gap between the lower substrate 110 and the upper substrate 130 and prevent misalignment of the connection structure 140.

Figure 5:
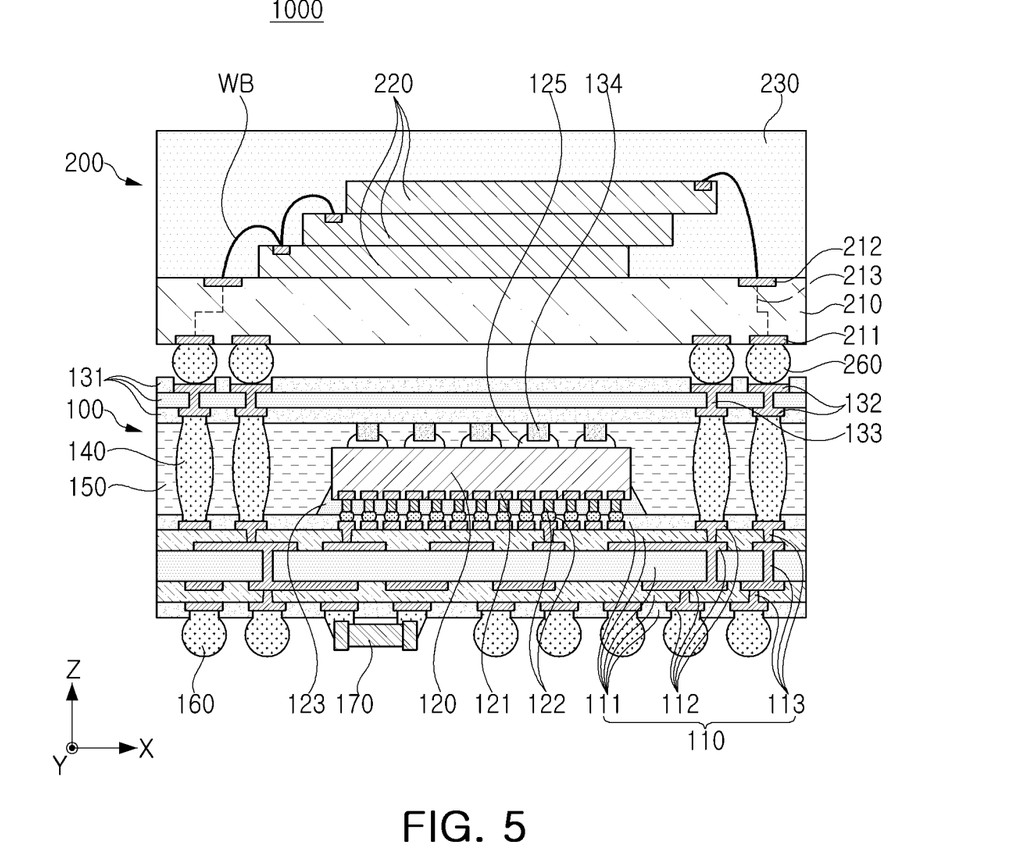
FIG. 5 is a cross-sectional view illustrating a semiconductor package according to an embodiment of the present disclosure.

FIG. 5 is a cross-sectional view illustrating a semiconductor package 1000 according to an embodiment of the present disclosure.

Referring to FIG. 5, the semiconductor package 1000 according to an embodiment may include a first package 100 and a second package 200. The first package 100 is illustrated to be the same as the semiconductor package 100A illustrated in FIG. 1A, but may be understood as having characteristics the same as or similar to those of the semiconductor package 100A, the semiconductor package 100B, the semiconductor package 100C, and/or the semiconductor package 100D described above with reference to FIGS. 1A to 4. Accordingly, the semiconductor package 1000 according to the present embodiment may implement a package-on-package (POP) structure having improved thickness uniformity and improved yield.

The second package 200 may include a redistribution substrate 210, a second semiconductor chip 220, and a second encapsulant 230. The redistribution substrate 210 may include a lower pad 211 and an upper pad 212 electrically connected to the outside on a lower surface and an upper surface of the redistribution substrate 210, respectively. Also, the redistribution substrate 210 may include a redistribution circuit 213 electrically connecting the lower pad 211 to the upper pad 212.

The second semiconductor chip 220 may be mounted on the redistribution substrate 210 by wire bonding or flip-chip bonding. For example, a plurality of the second semiconductor chip 220 may be vertically stacked on the redistribution substrate 210 and electrically connected to the upper pad 212 of the redistribution substrate 210 by a bonding wire WB. In an example, the second semiconductor chip 220 may include a memory chip, and the semiconductor chip 120 (referred to as a first semiconductor chip) may include an AP chip.

The second encapsulant 230 may include a material the same as or similar to a material of the encapsulant 150 of the first package 100. The second package 200 may be physically and electrically connected to the first package 100 by metal bumps 260. The metal bumps 260 may be electrically connected to the redistribution circuit 213 inside the redistribution substrate 210 through the lower pad 211 of the redistribution substrate 210. The metal bumps 260 may include a low-melting-point metal, for example, tin (Sn) or an alloy including tin (Sn).

Figure 6A:
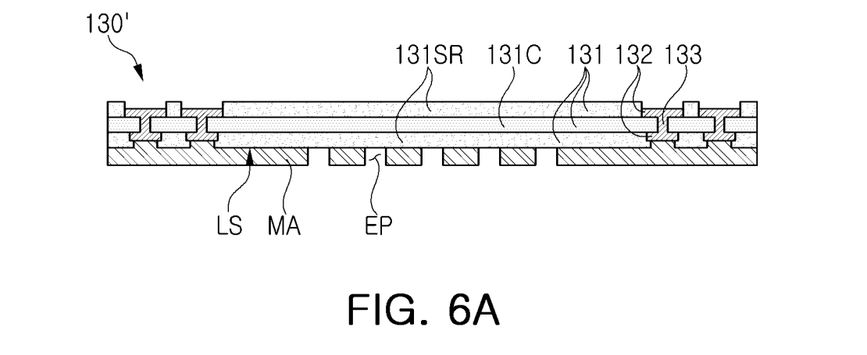
FIG. 6A is a first cross-sectional view illustrating a manufacturing process of an upper substrate applicable to embodiments of the present disclosure.
Figure 6B:
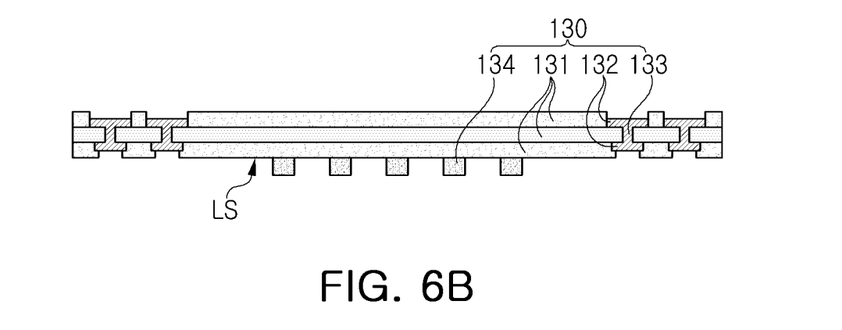
FIG. 6B is a second cross-sectional view illustrating the manufacturing process of the upper substrate applicable to embodiments of the present disclosure.

FIGS. 6A to 6B are cross-sectional views illustrating a process of manufacturing the upper substrate 130 applicable to embodiments of the present disclosure.

Referring to FIG. 6A, first, a preliminary upper substrate 130' on which a plurality of an insulating layer 131, an upper wiring layer 132, and an upper wiring via 133 are formed is prepared. Among the plurality of the insulating layer 131, a core insulating layer 131C may be formed using, for example, a copper clad laminate. The upper wiring layer 132 and the upper wiring via 133 may be formed on both surfaces of the core insulating layer 131C using a photolithography process, a plating process, an etching process, or the like. According to an embodiment, a greater number of insulating layers and upper wiring layers than those shown in the drawings may be formed on both surfaces of the core insulating layer 131C. The uppermost and lowermost insulating layers from among the plurality of the insulating layer 131 may be solder resist layers 131SR formed by applying solder resist ink (e.g., PSR ink) and performing an exposure process and a developing process. The preliminary upper substrate 130' may have a lower surface LS provided by the lower solder resist layer from among the solder resist layers 134SR.

Thereafter, a patterned mask layer MA may be formed on the lower surface LS of the preliminary upper substrate 130'. The mask layer MA may include an etch pattern EP exposing a portion of the lower solder resist layer from among the solder resist layers 134SR. The mask layer MA may include a thermosetting resin, a UV curable resin, or a composite curable resin. Thereafter, support members 134 (refer to FIG. 6B) may be formed by filling the etch pattern EP of the mask layer MA with solder resist ink.

Referring to FIG. 6B, the etch pattern ("EP" of FIG. 6A) may be filled with a solder resist ink, and the mask layer ("MA" of FIG. 6A) may be removed to manufacture the upper substrate 130 on which the support members 134 are formed. The support members 134 may be formed by applying a solder resist ink including an epoxy-based, melamine-based, or imidazole-based resin. The support members 134 may protrude from the lower surface LS of the upper substrate 130. The support members 134 may secure a space between the upper substrate 130 and the semiconductor chip ("120" in FIG. 7C) in a process to be described below.

Figure 7A:
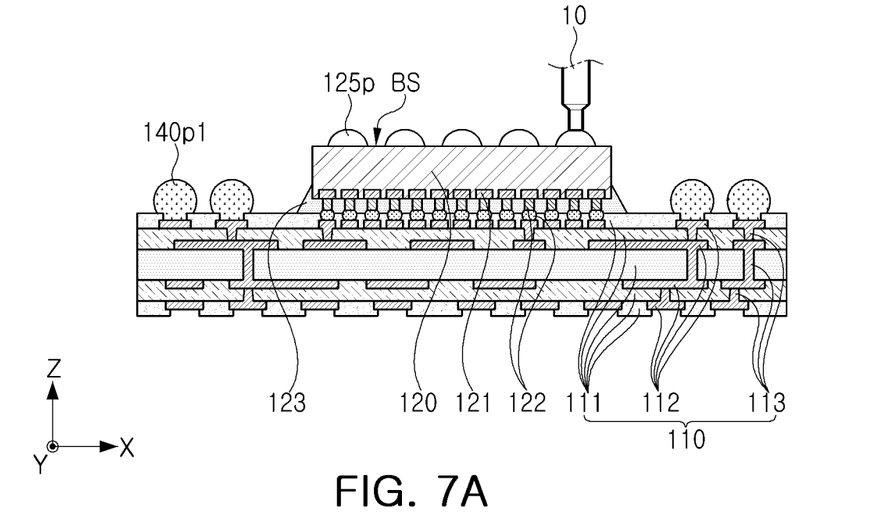
FIG. 7A is a first cross-sectional view illustrating a process of bonding an upper substrate to a semiconductor chip.
Figure 7B:
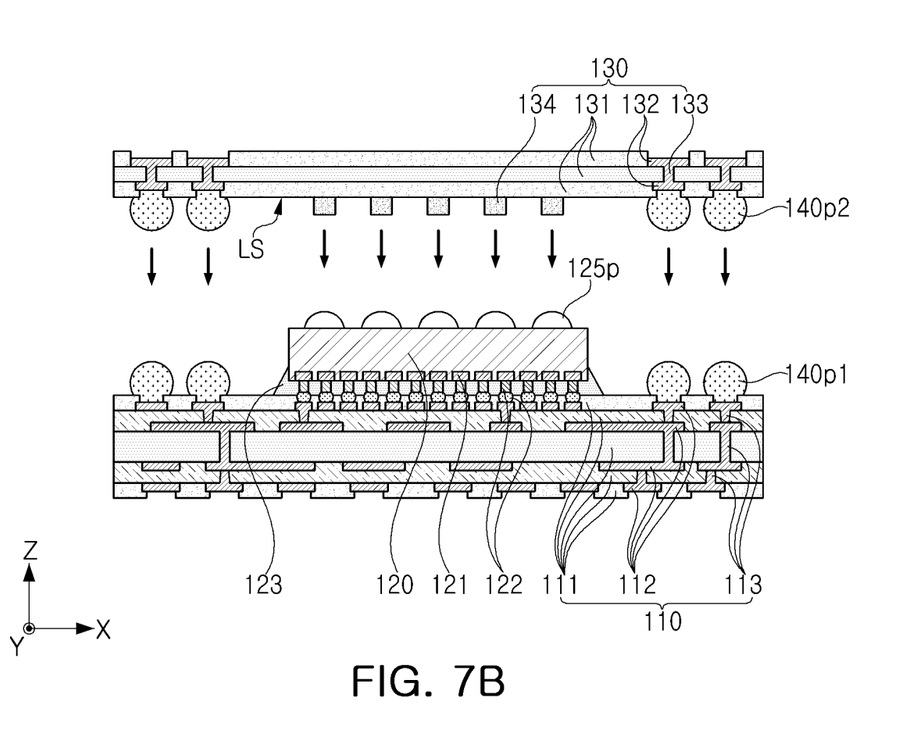
FIG. 7B is a second cross-sectional view illustrating the process of bonding the upper substrate to the semiconductor chip.
Figure 7C:
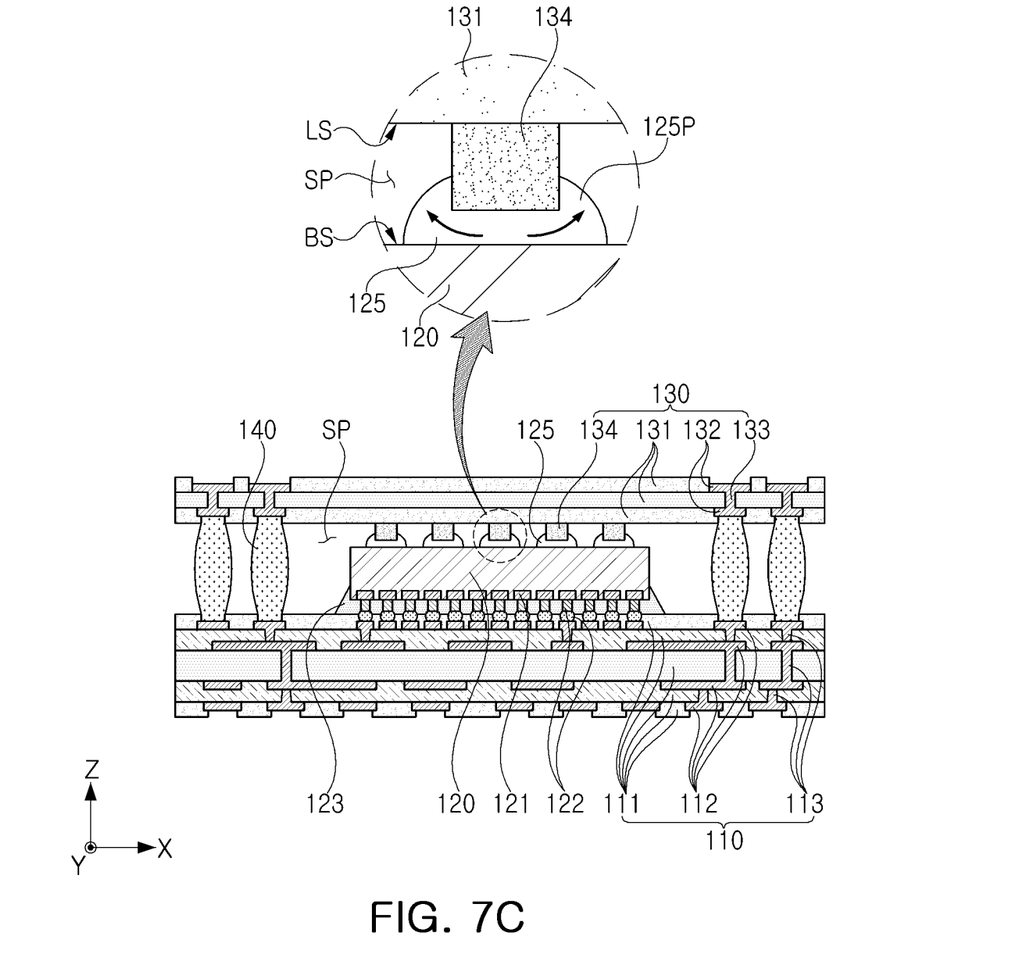
FIG. 7C is a third cross-sectional view illustrating the process of bonding the upper substrate to the semiconductor chip.

FIGS. 7A to 7C are cross-sectional views illustrating a process of bonding the upper substrate 130 to the semiconductor chip 120. FIGS. 7B and 7C illustrate a process of bonding the upper substrate 130 shown in FIG. 6B to the lower substrate 110 on which the semiconductor chip 120 is mounted.

Referring to FIG. 7A, preliminary adhesive members 125p may be formed on the semiconductor chip 120 mounted on the lower substrate 110. The preliminary adhesive members 125p may be seated on the second surface BS of the semiconductor chip 120 by, for example, a dotting tool 10. The preliminary adhesive members 125p may be disposed to correspond to the support members ("134" of FIG. 7B) of the upper substrate 130 in a process to be described below. The dotting amount of the preliminary adhesive members 125p may be adjusted according to a size and pitch of the support members ("134" in FIG. 7B) of the upper substrate 130. For example, the preliminary adhesive members 125p may be formed to have a volume of about 20% to about 50% of a volume of the support members ("134" of FIG. 7B). If the dotting amount of the preliminary adhesive members 125*p* is less than about 20% of the volume of the support members ("134" of FIG. 7B), adhesion between the support members ("134" of FIG. 7B) and the semiconductor chip 120 may be deteriorated and voids may occur. If the dotting amount of the preliminary adhesive members 125*p* exceeds about 50% of the volume of the support members ("134" of FIG. 7B), the preliminary adhesive members 125*p* may overflow in a thermal compression process and may deviate from a designated position (a position corresponding to the support members). The semiconductor chip 120 may be supported and fixed on the lower substrate 110 by an underfill member 123. A first preliminary connection structure 140*p*1 seated on the lower wiring layer 112 may be disposed on the lower substrate 110. The first preliminary connection structure 140*p*1 may have, for example, a spherical or ball shape formed of a low-melting-point metal such as tin (Sn), indium (In), bismuth (Bi), antimony (Sb), copper (Cu), silver (Ag), zinc (Zn), lead (Pb) or alloys thereof (e.g., Sn—Ag—Cu).

Referring to FIG. 7B, the upper substrate 130 in which a second preliminary connection structure 140*p*2 is seated on the lower surface LS may be prepared. The second preliminary connection structure 140*p*2 may be connected to the upper wiring layer 132 and may have a spherical or ball shape formed of a low-melting-point metal similar to the first preliminary connection structure 140*p*1. The upper substrate 130 may be aligned on the lower substrate 110 so that the second preliminary connection structure 140*p*2 and the support members 134 overlap the first preliminary connection structure 140*p*1 and the preliminary adhesive members 125*p* of the lower substrate 110 in the vertical direction (the Z-axis direction). Surfaces of the first preliminary connection structure 140*p*1 and the second preliminary connection structure 140*p*2 may be coated with a flux layer (not shown).

Referring to FIG. 7C, a thermal compression bonding process may be performed to form the connection structure 140 and the adhesive members 125. The first preliminary connection structure 140*p*1 shown in FIG. 7B and the second preliminary connection structure 140*p*2 shown in FIG. 7B may be reflowed and fused to each other. In addition, the preliminary adhesive members 125*p* shown in FIG. 7B may be raised alongside surfaces of the support members 134 by a thermal compression process. Accordingly, at least a portion of the adhesive members 125 may surround a portion of side surfaces of the support members 134, and may have a protrusion 125P extending outwardly of the support members 134.

Thereafter, a cleaning solution (e.g., purified water) may be introduced into a remaining space SP between the lower substrate 110 and the upper substrate 130 to remove a flux residue, and the encapsulant ("150" of FIG. 1A) may be applied. According to embodiments of the present disclosure, since the space between the support members 134 and the semiconductor chip 120 is filled with the adhesive members 125, the encapsulant ("150" of FIG. 1A) filling the remaining space SP may be formed to surround outer surfaces of the adhesive members 125 and the side surfaces of the support members 134 exposed from the adhesive members 125.

According to embodiments of the present disclosure, a semiconductor package having improved thickness uniformity by including adhesive members connecting support members of an upper substrate to an inactive surface of a semiconductor chip may be provided.

While non-limiting example embodiments have been shown and described above, it will be apparent to those skilled in the art that modifications and variations could be made without departing from the scope of the present disclosure.

What is claimed is:

1. A semiconductor package comprising:
a lower substrate comprising a lower wiring layer;
a semiconductor chip disposed on the lower substrate, the semiconductor chip comprising:
a first surface facing the lower substrate,
connection pads electrically connected to the lower wiring layer, the lower wiring layer disposed on the first surface, and
a second surface opposite to the first surface;
an upper substrate disposed on the lower substrate and the semiconductor chip, the upper substrate comprising a lower surface on which support members protruding toward the second surface of the semiconductor chip are disposed, and the upper substrate further comprising an upper wiring layer;
a connection structure disposed between the lower substrate and the upper substrate and electrically connecting the lower wiring layer to the upper wiring layer;
an encapsulant filling a space between the lower substrate and the upper substrate and encapsulating at least a portion of each of the semiconductor chip and the connection structure;
adhesive members disposed on the second surface of the semiconductor chip such as to correspond to the support members, respectively, the adhesive members disposed in contact with each of the second surface and the support members; and
connection bumps disposed below the lower substrate and electrically connected to the lower wiring layer,
wherein each of the support members comprises an upper surface that faces towards the lower surface of the upper substrate,
wherein the upper surface of each of the support members is in contact with the lower surface of the upper substrate, and
wherein an uppermost portion of each of the adhesive members is lower than the upper surface of a corresponding support member from among the support members.

2. The semiconductor package of claim 1, wherein
each support member from among the support members further comprises a lower surface facing the second surface of the semiconductor chip and a side surface extending from the lower surface of the support member to the lower surface of the upper substrate, and
the adhesive members are in contact with at least a portion of the side surface of the corresponding support member from among the support members.

3. The semiconductor package of claim 1, wherein at least some of the support members are spaced apart from the second surface of the semiconductor chip.

4. The semiconductor package of claim 3, wherein the adhesive members fill a space between the at least some of the support members and the second surface of the semiconductor chip.

5. The semiconductor package of claim 1, wherein the adhesive members are spaced apart from each other.

6. The semiconductor package of claim 5, wherein the encapsulant fills a space between the adhesive members.

7. The semiconductor package of claim 1, wherein the encapsulant surrounds at least a portion of each of the support members and the adhesive members.

8. The semiconductor package of claim 7, wherein the encapsulant is not interposed between the support members and the second surface of the semiconductor chip.

9. The semiconductor package of claim 1, wherein the adhesive members comprise an insulating resin and fillers dispersed in the insulating resin.

10. The semiconductor package of claim 9, wherein the insulating resin comprises a thermosetting resin, a thermoplastic resin, or a mixture thereof.

11. The semiconductor package of claim 9, wherein the fillers comprise an insulating filler or a conductive filler.

12. The semiconductor package of claim 1, wherein a distance between the second surface of the semiconductor chip and the lower surface of the upper substrate is in a range of 15 µm to 35 µm.

13. The semiconductor package of claim 1, further comprising an underfill member disposed between the lower substrate and the first surface of the semiconductor chip.

14. A semiconductor package comprising:
a lower substrate comprising a lower wiring layer;
a semiconductor chip disposed on the lower substrate, the semiconductor chip comprising:
  a first surface facing the lower substrate,
  connection pads electrically connected to the lower wiring layer, the lower wiring layer disposed on the first surface, and
  a second surface opposite to the first surface;
an upper substrate disposed on the lower substrate and the semiconductor chip, the upper substrate comprising a lower surface on which support members protruding toward the second surface of the semiconductor chip are disposed, and the upper substrate further comprising an upper wiring layer;
a connection structure disposed between the lower substrate and the upper substrate and electrically connecting the lower wiring layer to the upper wiring layer; and
adhesive members disposed on the second surface of the semiconductor chip such as to correspond to the support members, respectively, and the adhesive members each comprise a protrusion that respectively extends outward from a side surface of a corresponding one of the support members in a first direction parallel to the second surface,
wherein the protrusion of each of the adhesive members is in contact with at least a portion of the side surface of each of the support members, respectively,
wherein each of the support members comprises an upper surface that faces towards the lower surface of the upper substrate,
wherein the upper surface of each of the support members is in contact with the lower surface of the upper substrate, and
wherein an uppermost portion of each of the adhesive members is lower than the upper surface of a corresponding support member from among the support members.

15. The semiconductor package of claim 14, wherein a width of the protrusion in the first direction, parallel to the second surface, is greater than a height of the protrusion, the width of the protrusion being a width from the side surface of the corresponding one of the support members to an outermost part of the protrusion in the first direction, parallel to the second surface, and the height of the protrusion being a height from a lower surface of the corresponding one of the support members to an uppermost part of the protrusion in a second direction perpendicular to the second surface.

16. The semiconductor package of claim 14, further comprising an encapsulant filling a space between the lower substrate and the upper substrate and encapsulating at least a portion of each of the semiconductor chip and the connection structure.

17. The semiconductor package of claim 16, wherein the encapsulant covers the second surface of the semiconductor chip, an outer surface of the protrusion, and at least a portion of a side surface of each of the support members, the portion of the side surface of each of the support members spaced apart from the protrusion of each of the adhesive members.

18. The semiconductor package of claim 14, wherein the support members overlap the semiconductor chip in a second direction perpendicular to the second surface.

19. A semiconductor package comprising:
a lower substrate;
a semiconductor chip disposed on the lower substrate, the semiconductor chip comprising a first surface facing the lower substrate, and further comprising a second surface opposite to the first surface;
an upper substrate disposed on the lower substrate and the semiconductor chip, the upper substrate comprising a lower surface on which support members protruding toward the second surface of the semiconductor chip are disposed;
adhesive members disposed between the second surface of the semiconductor chip and the support members such as to correspond to the support members, respectively; and
an encapsulant disposed between the lower substrate and the upper substrate and covering at least a portion of each of the semiconductor chip, the support members, and the adhesive members,
wherein each of the support members comprises an upper surface that faces towards the lower surface of the upper substrate,
wherein the upper surface of each of the support members is in contact with the lower surface of the upper substrate, and
wherein an uppermost portion of each of the adhesive members is lower than the upper surface of a corresponding support member from among the support members.

20. The semiconductor package of claim 19, wherein the adhesive members comprise a filler interposed between the support members and the second surface of the semiconductor chip.

* * * * *